(12) United States Patent
Myung et al.

(10) Patent No.: US 8,495,459 B2
(45) Date of Patent: Jul. 23, 2013

(54) CHANNEL-ENCODING/DECODING APPARATUS AND METHOD USING LOW-DENSITY PARITY-CHECK CODES

(75) Inventors: Se Ho Myung, Suwon-si (KR); Jae Yoel Kim, Suwon-si (KR); Yeon Ju Lim, Seoul (KR); Sung Ryul Yun, Suwon-si (KR); Hak Ju Lee, Icheon Metropolitan (KR)

(73) Assignee: Samsung Electronics Co., Ltd (KR)

( * ) Notice: Subject to any disclaimer, the term of this patent is extended or adjusted under 35 U.S.C. 154(b) by 738 days.

(21) Appl. No.: 12/624,098

(22) Filed: Nov. 23, 2009

(65) Prior Publication Data

US 2010/0138720 A1   Jun. 3, 2010

(30) Foreign Application Priority Data

Nov. 24, 2008   (KR) .................. 10-2008-0117008

(51) Int. Cl.
*H03M 13/00* (2006.01)
(52) U.S. Cl.
USPC ............................. 714/758; 714/752; 714/781
(58) Field of Classification Search
USPC ......................... 714/758, 781, 752
See application file for complete search history.

(56) References Cited

U.S. PATENT DOCUMENTS

| | | | |
|---|---|---|---|
| 7,506,238 B2* | 3/2009 | Hocevar | 714/781 |
| 7,966,544 B2* | 6/2011 | Paumier et al. | 714/755 |
| 8,171,374 B2* | 5/2012 | Miyazaki | 714/758 |
| 2005/0223305 A1 | 10/2005 | Kons | |
| 2005/0289437 A1* | 12/2005 | Oh et al. | 714/758 |
| 2006/0036926 A1* | 2/2006 | Hocevar | 714/758 |
| 2007/0033483 A1* | 2/2007 | Jeong et al. | 714/758 |
| 2007/0162816 A1 | 7/2007 | Kim et al. | |
| 2009/0265600 A1* | 10/2009 | Matsumoto et al. | 714/752 |

FOREIGN PATENT DOCUMENTS

| | | |
|---|---|---|
| KR | 1020050035729 | 4/2005 |
| KR | 1020070042105 | 4/2007 |
| KR | 1020070068675 | 7/2007 |
| KR | 1020070086301 | 8/2007 |
| WO | WO 2005/036758 | 4/2005 |
| WO | WO 2006/065286 | 6/2006 |
| WO | WO 2007/075043 | 7/2007 |

* cited by examiner

*Primary Examiner* — Charles Ehne
(74) *Attorney, Agent, or Firm* — The Farrell Law Firm, P.C.

(57) ABSTRACT

An encoding/decoding apparatus and method using a low-density parity-check code (LDPC code) is disclosed. Basic column group information, serving as a set of information regarding positions of rows with weight 1, is extracted from a reference column in each column group of a predetermined parity-check matrix. Column group information transforms the positions of rows with weight 1 into positions whose lengths are within a required parity length. A parity-check matrix is generated according to the generated column group information. Data is encoded or decoded based on the generated parity-check matrix.

8 Claims, 10 Drawing Sheets

FIG . 1

(CONVENTIONAL ART)

$$H_1 = \begin{bmatrix} 1 & 1 & 1 & 1 & 1 & 1 & 0 & 0 \\ 1 & 1 & 0 & 1 & 0 & 1 & 1 & 0 \\ 1 & 1 & 1 & 0 & 0 & 0 & 1 & 1 \\ 1 & 0 & 1 & 1 & 1 & 0 & 0 & 1 \end{bmatrix}$$

CHANNEL-ENCODING/DECODING APPARATUS AND METHOD USING LOW-DENSITY PARITY-CHECK CODES

PRIORITY

This application claims priority to an application entitled "CHANNEL-ENCODING/DECODING. APPARATUS AND METHOD USING LOW-DENSITY PARITY-CHECK CODES" filed in the Korean Intellectual Property Office on Nov. 24, 2008 and assigned Serial No. 10-2008-0117008, the contents of which are incorporated herein by reference.

BACKGROUND OF THE INVENTION

1. Field of the Invention

The present invention relates to data processing technology using an error correcting code, and more particularly, to a channel encoding/decoding apparatus and method using a Low-Density Parity-Check (LDPC) code.

2. Description of the Related Art

In a wireless communication system, the performance of a link can be significantly deteriorated due to a variety of causes, such as Inter-Symbol Interference (ISI), various noises, and fading phenomena of a channel. It is necessary to develop technology in order to resolve the problems caused by noises, fading, and ISI in order to implement high-speed digital communication systems that require a large amount of data processing and a high reliability of data, such as next generation mobile communication systems, digital broadcasting systems, and mobile Internet communication systems. Active research has recently been conducted on the utilization of an error-correction code as a method for efficiently restoring the distorted information and enhancing the reliability of communication.

The Low-Density Parity-Check (LDPC) code, first introduced by Gallager in the 1960's, has been underutilized due to its complexity of implementation, which far surpassed the technology available at that time. However, as a turbo code discovered by Berrou, Glavieux, and Thitimajshima in 1993 shows the performance approaching Shannon's channel capacity, extensive analytical research has been performed on the performance and characteristics of the turbo code. Research has also been conducted on channel encoding based on iterative decoding and graphs. The research as described above has led to the resurgence of the LDPC code in the late 1990's. The resurgence showed that the performance of the LDPC code approaches Shannon's channel capacity when decoding is performed by applying the iterative decoding based on a sum-product algorithm on a Tanner graph (a special case of a factor graph) corresponding to the LDPC code.

SUMMARY OF THE INVENTION

The present invention has been made in view of the above problems, and provides a method and apparatus that sub-optimizes cycle characteristics of the Low-Density Parity-Check (LDPC) code during the LDPC code design and thus leads to the efficient design of the parity check matrix of the LDPC code.

The present invention further provides a method and apparatus that generates a LDPC code having different block lengths from the parity check matrix of a LDPC code that is designed by sub-optimizing cycle characteristics of a LDPC in order to increase the storage efficiency of a memory that stores LDPC codes.

In accordance with an embodiment, the present invention provides a method for encoding an LDPC code including extracting basic column group information, serving a set of information regarding positions of rows with weight 1, from a reference column in each column group of a predetermined parity-check matrix; generating column group information that transforms the positions of rows with weight 1 in the reference column of each column group in the extracted basic column group information into to positions whose lengths are within a required parity length; generating a parity-check matrix using the generated column group information; and encoding data using the generated parity-check matrix.

In accordance with another embodiment, the present invention provides a method for decoding an LDPC code including extracting basic column group information, serving a set of information regarding positions of rows with weight 1, from a reference column in each column group of a predetermined parity-check matrix; generating column group information that transforms the positions of rows with weight 1 in the reference column of each column group in the extracted basic column group information into to positions whose lengths are within a required parity length; generating a parity-check matrix using the generated column group information; and decoding data using the generated parity-check matrix.

In accordance with another embodiment, the present invention provides an apparatus for encoding an LDPC code including an LDPC code parity-check matrix extracting part that extracts basic column group information, serving a set of information regarding positions of rows with weight 1, from a reference column in each column group of a predetermined parity-check matrix; generates column group information that transforms the positions of rows with weight 1 in the reference column of each column group in the extracted basic column group information into to positions whose lengths are within a required parity length; and generates a parity-check matrix using the generated column group information; and an LDPC encoder that encodes data using the generated parity-check matrix.

In accordance with another embodiment, the present invention provides an apparatus for decoding a LDPC code including an LDPC code parity-check matrix extracting part that extracts basic column group information, serving a set of information regarding positions of rows with weight 1, from a reference column in each column group of a predetermined parity-check matrix; generates column group information that transforms the positions of rows with weight 1 in the reference column of each column group in the extracted basic column group information into to positions whose lengths are within a required parity length; generates a parity-check matrix using the generated column group information; and an LDPC decoder that decodes data using the generated parity-check matrix.

BRIEF DESCRIPTION OF THE DRAWINGS

The features and advantages of the present invention will become more apparent from the following detailed description in conjunction with the accompanying drawings, in which.

DETAILED DESCRIPTION OF EXEMPLARY EMBODIMENTS

Hereinafter, embodiments of the present invention are described in detail with reference to the accompanying drawings. The same reference numbers are used throughout the drawings to refer to the same or similar parts. Detailed descriptions of well-known functions and structures incorporated herein may be omitted to avoid obscuring the subject matter of the present invention.

A Low-Density Parity-Check (LDPC) code is usually represented using a graph representation method. The characteristics of the LDPC code can be analyzed using a variety of methods based on graph theory, algebra, and probability theory. In general, a graph model is useful for describing a channel code. That is, when information regarding encoded bits is mapped to the vertexes in a graph and the relationship among the respective encoded bits corresponds to edges in the graph, the graph model may be considered a communication network where the vertexes exchange predetermined messages through the edges. Therefore, a decoding algorithm can be naturally derived from the graph model. For example, examples of a decoding algorithm derived from a Trellis, a type of graph, are a Viterbi algorithm and a Bahl, Cocke, Jelinek, and Raviv (BCJR) algorithm.

The LDPC code is typically defined by a parity-check matrix, and can be represented using a bipartite graph commonly called a Tanner graph. In the bipartite graph, vertexes are divided into two different types. The LDPC code is represented by the bipartite graph composed of vertexes called 'variable nodes' and 'check node.' The variable nodes correspond to encoded bits, respectively.

Figure 1:
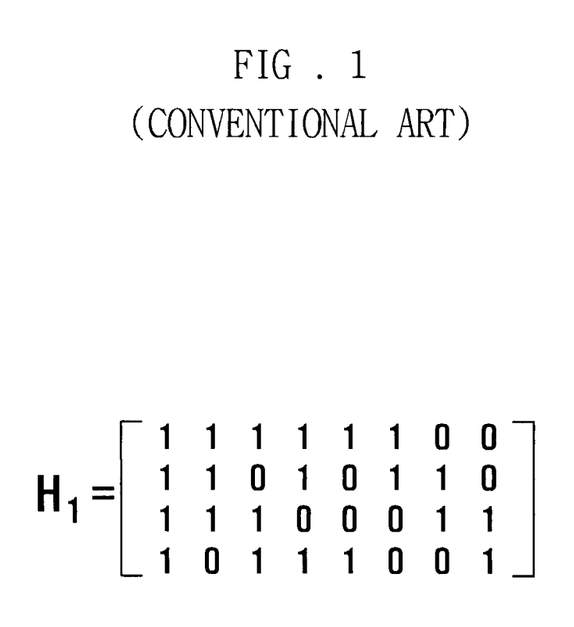
FIG. 1 shows a parity-check matrix of a LDPC code with a length of 8.
Figure 2:
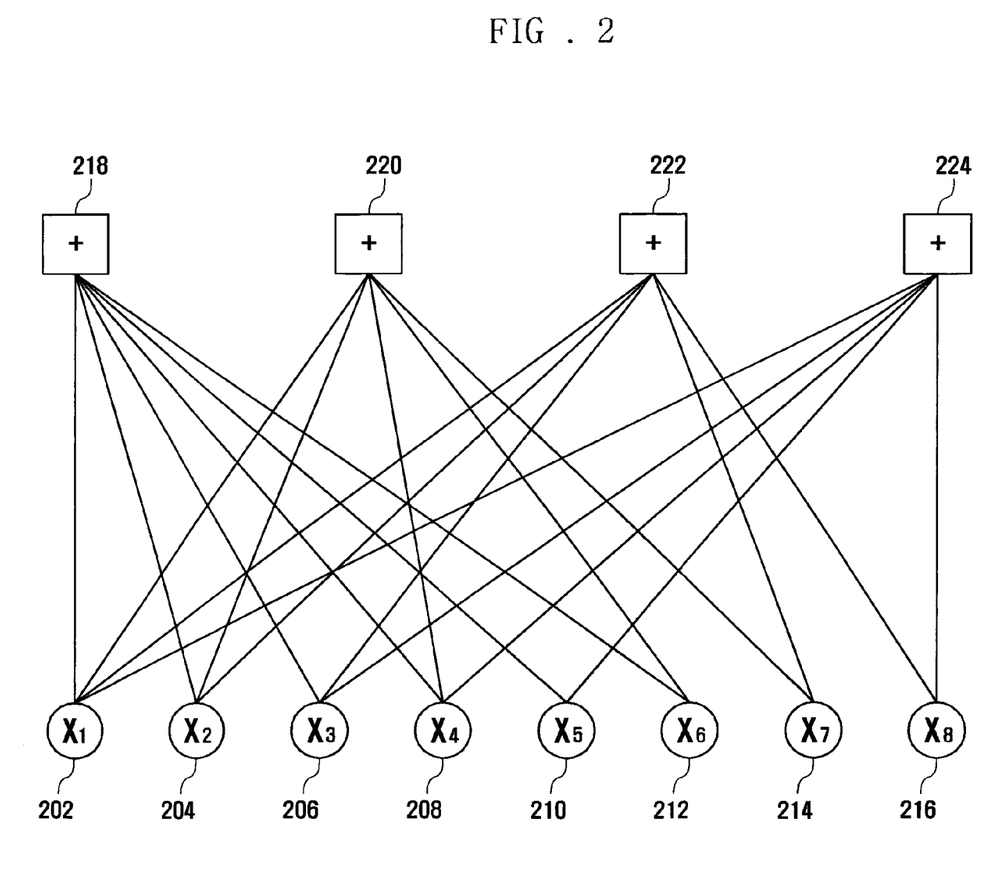
FIG. 2 is a diagram illustrating a Tanner graph of the parity-check matrix corresponding to the LDPC code with a length of 8.

A description is provided for a graph representation method of the LDPC code, referring to FIGS. 1 and 2.

FIG. 1 shows an example of a parity-check matrix $H_1$ of an LDPC code. In an embodiment of the present invention, the parity-check matrix $H_1$ is a 4×8 matrix. Referring to FIG. 1, since the matrix $H_1$ has 8 columns, an LDPC code generates a codeword with a length of 8, and each column corresponds to 8 encoded bits.

FIG. 2 is a diagram illustrating a Tanner graph corresponding to the parity-check matrix $H_1$ of the LDPC code with a length of 8.

Referring to FIG. 2, the Tanner graph of the LDPC code includes eight variable nodes $x_1(202)$, $x_2(204)$, $x_3(206)$, $x_4(208)$, $x_5(210)$, $x_6(212)$, $x_7(214)$, and $x_8(216)$, and four check nodes 218, 220, 222, and 224. The $i^{th}$ column and $j^{th}$ row in the parity-check matrix $H_1$ of the LDPC code correspond to the variable node xi and the $j^{th}$ check node, respectively. In addition, a value of 1, i.e., a non-zero value, at the point where an $i^{th}$ column and a $i^{th}$ row in the parity-check matrix $H_1$ of the LDPC code cross each other, indicates that there is an edge between the variable node $x_i$ and the $j^{th}$ check node on the Tanner graph shown in FIG. 2.

In the Tanner graph of the LDPC code, the degree of the variable node and the check node indicates the number of edges linked to respective nodes. That is, the degree is equal to the number of non-zero entries in a column or row corresponding to a node in the parity-check matrix of the LDPC code. For example, as shown in FIG. 2, the degrees of the variable nodes $x_1(202)$, $x_2(204)$, $x_3(206)$, $x_4(208)$, $x_5(210)$, $x_6(212)$, $x_7(214)$, and $x_8(216)$ are 4, 3, 3, 3, 2, 2, 2, and 2, respectively. The degrees of check nodes 218, 220, 222, and 224 are also 6, 5, 5, and 5, respectively. Furthermore, the numbers of non-zero entries in the columns of the parity-check matrix $H_1$ of FIG. 1, which correspond to the variable nodes of FIG. 2, are consistent with the degrees 4, 3, 3, 3, 2, 2, 2, and 2, respectively. Similarly, the numbers of non-zero entries in the rows of the parity-check matrix $H_1$ of FIG. 1, which correspond to the check nodes of FIG. 2, are also consistent with the degrees 6, 5, 5, and 5, respectively.

In order to express the distribution of the degree of nodes with respect to the LDPC code, a ratio of the number of degree-i variable nodes to the total number of variable nodes is defined as $f_i$, and a ratio of the number of degree-j check nodes to the total number of check nodes is defined as $g_j$. For example, in the LDPC code corresponding to FIGS. 1 and 2, $f_2=4/8$, $f_3=3/8$, $f_4=1/8$, and $f_i=0$ for $i \neq 2, 3$, and 4, and $g_5=3/4$, $g_6=1/4$, and $g_j=0$ for $j \neq 5$, and 6. When a length of the LDPC code, i.e., the number of columns, is defined as N, and the number of rows is defined as N/2, the density of non-zero entries in the entire parity-check matrix having the distribution of the degree described above is calculated as shown in Equation (1).

$$\frac{2f_2 N + 3f_3 N + 4f_4 N}{N \cdot N/2} = \frac{5.25}{N} \qquad (1)$$

In Equation (1), if N increases, the density of 1's in the parity-check matrix decreases. In general, since the density of non-zero entries is inversely proportional to the code length N, the LDPC code with a relatively large length N has a very low density of non-zero entries. The term 'low-density' in the name of the low-density parity-check code originates from the above-mentioned relationship.

Figure 3:
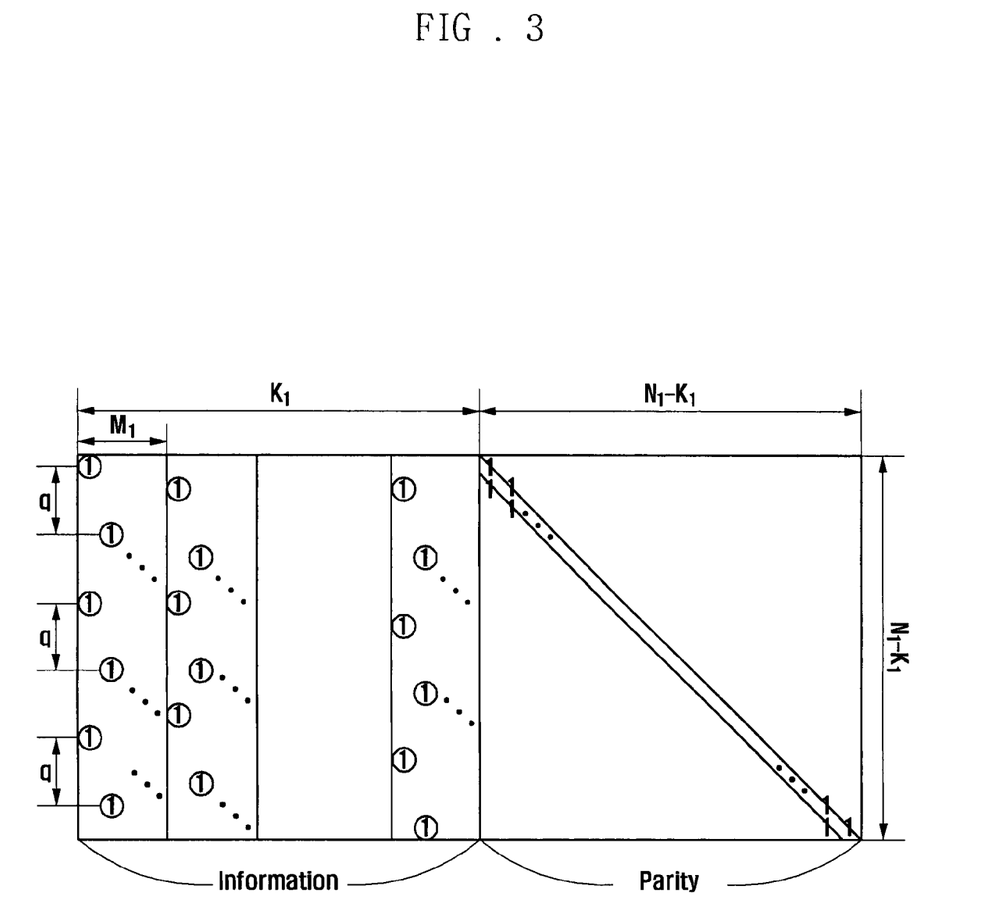
FIG. 3 is a diagram illustrating a structure of a DVB-S2 LDPC code.

FIG. 3 is a diagram illustrating a structure of a DVB-S2 LDPC code. A description is provided for the characteristics of the parity-check matrix of the LDPC code having a particular structure referring to FIG. 3, where the LDPC code has been adopted as the standard technology in Digital Video Broadcasting-Satellite transmission 2$^{nd}$ generation (DVB-S2), which is one of the European digital broadcasting standards.

Referring to FIG. 3, $N_1$ denotes a length of an LDPC codeword, $K_1$ a length of an information word, and ($N_1-K_1$) a parity length. Integers, $M_1$ and q, are determined to satisfy $q=(N_1-K_1)/M_1$. Preferably, $K_1/M_1$ should also be an integer. For convenience, the parity-check matrix of FIG. 3 is called a first parity-check matrix $H_1$.

As shown in FIG. 3, a parity portion, i.e., $K_1^{th}$ through $(N_1-1)^{th}$ columns, in the parity-check matrix, forms a dual diagonal shape. Therefore, in the distribution of the degree of columns corresponding to the parity portion, all columns have a degree '2', except for the last column having a degree '1'.

A portion corresponding to information word, i.e., $0^{th}$ through $(K_1-1)^{th}$ columns, in the parity-check matrix, satisfies the following Rules 1 and 2.

Rule 1

The portion generates a total of $K_1/M_1$ column groups by grouping $K_1$ columns corresponding to the information word in the parity-check matrix into multiple groups each including $M_1$ columns. A method for forming columns belonging to each column group follows Rule 2 below.

Rule 2

The portion determines positions of '1's in each $0^{th}$ column in $i^{th}$ column group (i=1, ..., $K_1/M_1-1$). The degree of a $0^{th}$ column in each $i^{th}$ column group is hereinafter denoted by $D_i$. If it is assumed that positions of rows with 1 are $R_{i,0}^{(1)}$, $R_{i,0}^{(2)}$, ..., $R_{i,0}^{(Di)}$, positions $R_{i,j}^{(k)}$ (k=1, 2, ..., $D_i$) of rows with 1 are defined as shown in Equation (2), in a $j^{th}$ column (j=1, 2, ..., $M_1-1$) in an $i^{th}$ column group.

$$R_{i,j}^{(k)}=R_{i,(j-1)}^{(k)}+q \mod(N_1-K_1) \quad (2)$$

Where k=1, 2, ..., $D_i$, i=1, ..., $K_1/M_1-1$, and j=1, 2, ..., $M_1-1$.

According to Rules 1 and 2, the degrees of columns belonging to an $i^{th}$ column group are all equal to $D_i$.

Through an example, the structure of the LDPC code, as shown in FIG. 3, is explained in detail that stores information regarding the parity-check matrix according to rules 1 and 2.

For example, if $N_1$=30, $K_1$=15, $M_1$=5, and q=3, information regarding the positions of rows with weight 1 in the $0^{th}$ columns in 3 column groups can be expressed as follows:

$R_{1,0}^{(1)}$=0, $R_{1,0}^{(2)}$=1, $R_{1,0}^{(3)}$=2
$R_{2,0}^{(1)}$=0, $R_{2,0}^{(2)}$=11, $R_{2,0}^{(3)}$=13
$R_{3,0}^{(1)}$=0, $R_{3,0}^{(2)}$=10, $R_{3,0}^{(3)}$=14

A set of information regarding the positions of rows with weight 1 in reference columns in each column group can be called column group information. For convenience, in an embodiment of the present invention, the $0^{th}$ column represents the reference column in each column group. It should be understood that other columns, for example, the 1$^{st}$ columns in each column group, may be a reference column. In that case, column group information may contain information regarding the positions of rows with weight 1 in the 1$^{st}$ column in each column group. It will be appreciated that information regarding the positions of rows with weight 1 in the $0^{th}$ columns and other columns in each column group can be extracted by the same method.

Regarding the rows with weight 1 in the $0^{th}$ columns in each column group, only the corresponding position information is expressed for each column group as follows:

[0, 1, 2]
[0, 11, 13]
[0, 10, 14]

The $i^{th}$ column sequence sequentially represents information regarding the positions of rows with weight 1 in the $0^{th}$ column in the $i^{th}$ column group.

Figure 4:
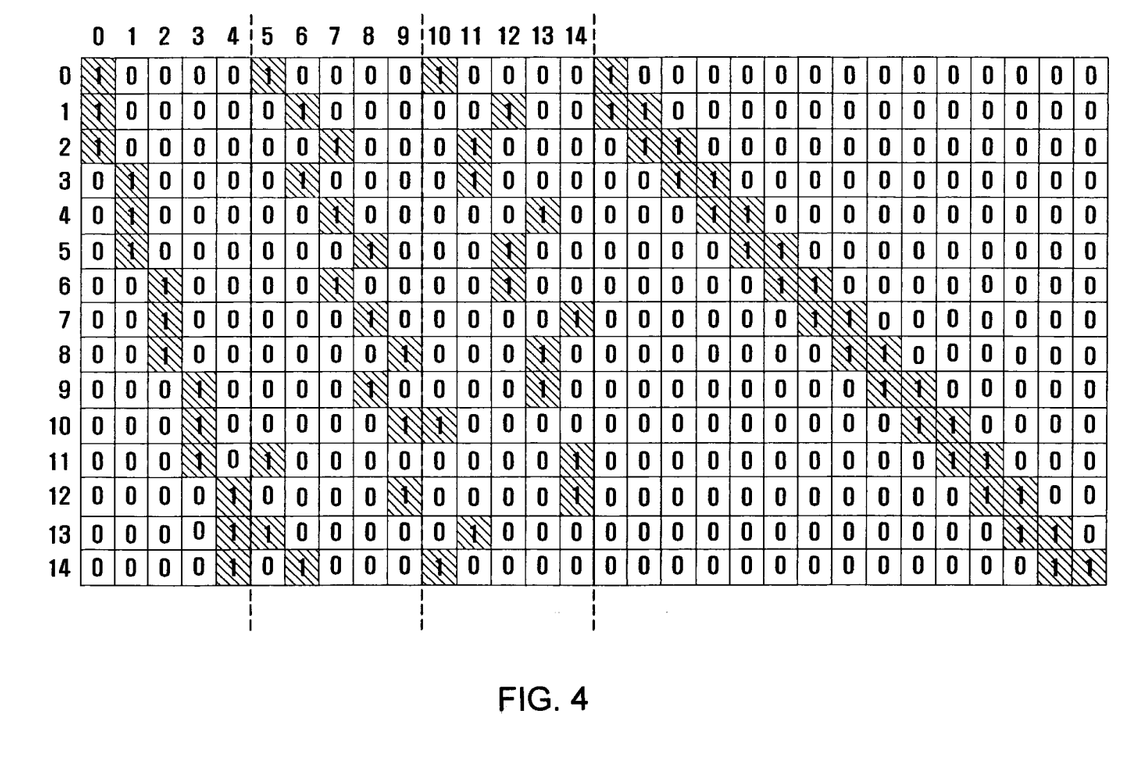
FIG. 4 is a diagram illustrating a parity-check matrix of an LDPC code in the form of DVB-S2.

FIG. 4 is a diagram illustrating a parity-check matrix of an LDPC code in the form of DVB-S2.

If a parity-check matrix is formed by using the information corresponding to the detailed example and Rules 1 and 2, as described above, it is possible to generate an LDPC code, as shown in FIG. 4, having the same concept as that of the DVB-S2 LDPC code of FIG. 3.

It is well known that the performance of an LDPC code is closely related to cycle characteristics of a Tanner graph. If the number of short cycles is numerous on a Tanner graph, it has been empirically proven that performance aging may occur in the LDPC code. It should be considered characteristic of the cycles on the Tanner graph in order to design an LDPC code having a preferable performance.

It is, however, difficult to design a parity-check matrix of the LDPC code whose codeword length is a few tens of bits by considering the characteristics of cycles on a Tanner graph. A method has not yet been developed to enhance the characteristics of cycles of the LDPC code having the structure shown in FIG. 3. A DVB-S2 LDPC code employing the structure of the LDPC code does not take into account the optimization of the characteristics of cycles on a Tanner graph, and thus shows an error flow phenomenon with a high Signal to Noise Ratio (SNR).

Therefore, in order to design an LDPC code having the structure shown in FIG. 3, a method is required to improve the characteristics of cycles and design a parity-check matrix.

The DVB-S2 standard using the LDPC code is disadvantageous in that the LDPC code has only two block lengths due to code use limitation and the storage of different types of parity-check matrixes to support the two block lengths.

In order to apply an LDPC code to a real communication system, an LDPC code needs to be designed to comply with the data transmission amount that the real communication system requires. In particular, an LDPC code having a variety of block lengths is needed to support a variety of data transmission amounts according to a user's request in an adaptive communication system and a communication supporting a variety of broadcasting services. The adaptive communication system employs a Hybrid Automatic Retransmission reQuest (HARQ), an adaptive modulation and coding (AMC), etc.

The storage efficiency of a memory deteriorates if the memory stores independent parity-check matrixes with respect to each block length of an LDPC code. Therefore, a method is required to efficiently support a variety of block lengths from the existing parity-check matrix without designing a new parity-check matrix.

The present invention provides a method that designs a parity-check matrix with a large LDPC code from a parity-check matrix of an existing small LDPC code. It also provides an apparatus and method that supports a variable block length in a communication system using a particular form of LDPC code.

For convenience, it is assumed that an LDPC code is given that has a particular structure identical to that of the LDPC code that was designed based on Rules 1 and 2, as shown in FIG. 3. A parity-check matrix of the given LDPC code is referred to as a first parity-check matrix $H_1$. Lengths of a codeword and an information word of the matrix $H_1$ are represented by $N_1$ and $K_1$, respectively. ($N_1-K_1$) is a parity length. Integers $M_1$ and q are determined to satisfy $q=(N_1-K_1)/M_1$. $K_1/M_1$ is also an integer.

It is also assumed that the positions of 1's in each $0^{th}$ column in the $i^{th}$ column group (i=0, 1, ..., $K_1/M_1-1$), indicating information regarding the matrix $H_1$, are represented by $R_{i,0}^{(1)}, R_{i,0}^{(2)}, \ldots, R_{i,0}^{(Di)}$. The symbol $D_i$ is the degree of $0^{th}$ column in each $i^{th}$ column group.

The present invention provides a method that designs a second parity-check matrix $H_2$, satisfying the following Rules 3 to 6. It is assumed that the lengths of a codeword and an information word of the matrix $H_2$ are represented by $N_2$ and $K_2$, respectively.

Rule 3

A positive integer p has a relation as follows: $N_2=pN_1$, $K_2=pK_1$, and $M_2=pM_1$. Therefore, $K_2/M_2=K_1/M_1$ is achieved, so that the number of column groups with respect to the information word portion are identical to each other. In addition, $(N_2-K_2)/M_2=q=(N_1-K_1)/M_1$ is also established.

Rule 4

The distribution of the degrees of information word portions between the parity-check matrixes $H_1$ and $H_2$ are equal to each other. It is assumed that the position of 1's in each $0^{th}$ column in the $i^{th}$ column group (i=0, 1, ..., $K_1/M_1-1$) representing the parity-check matrix $H_2$ is $S_{i,0}^{(k)}$, where k=1, 2, ..., $D_i$. The symbol $D_i$ is the degree of $0^{th}$ column in each $i^{th}$ column group.

Rule 5

The characteristics of cycles on a Tanner graph of the matrix $H_2$ must not be worse than that of the matrix $H_1$.

Rule 6

A matrix $H_1$ can be generated from information regarding a matrix $H_2$.

Figure 5:
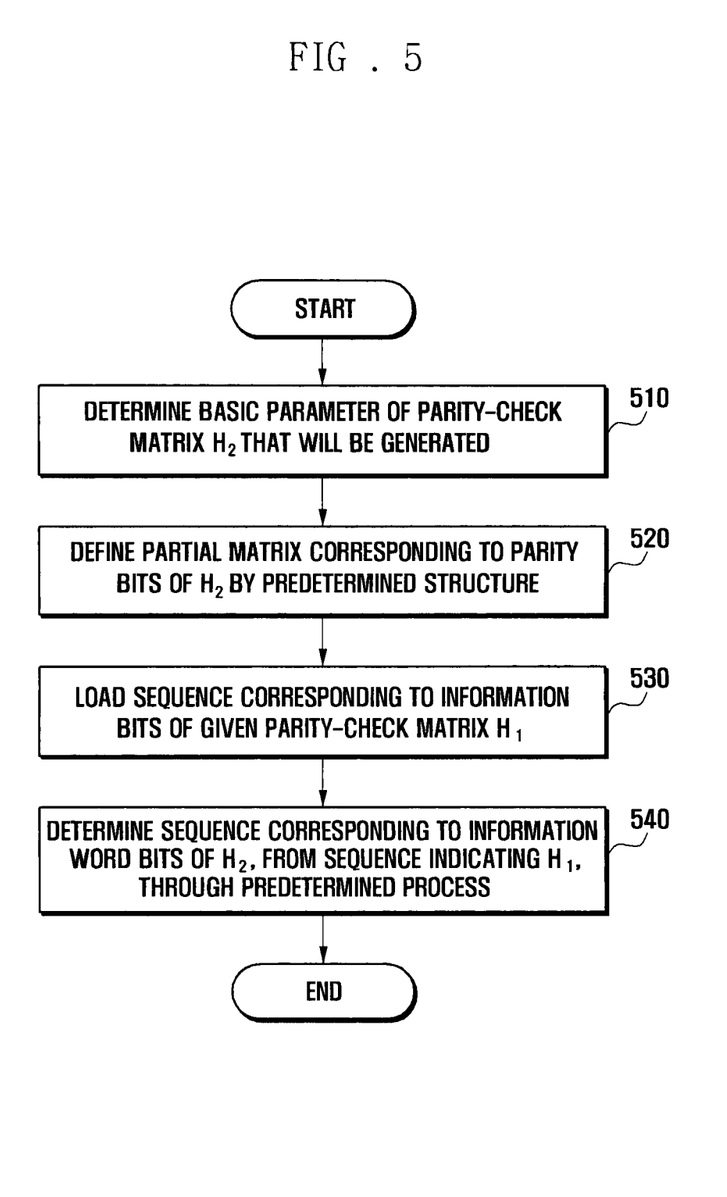
FIG. 5 is a flow chart describing a method for generating an LDPC code with a variable length from a parity-check matrix of a given LDPC code, according to an embodiment of the present invention.

FIG. 5 is a flow chart describing a method for generating an LDPC code with different block lengths from a parity-check matrix of a given LDPC code, according to an embodiment of the present invention.

In step 510 the method determines a basic parameter of the parity-check matrix $H_2$ that will be generated. In step 520 the method defines a partial matrix corresponding to the parity bits of $H_2$ by the predetermined structure. In step 530 the method loads the sequence corresponding to the information bits of the given parity-check matrix $H_1$. In step 540 the method determines the sequence corresponding to the information word bits of $H_2$, from the sequence indicating $H_1$ through the predetermined process.

Referring to FIG. 5, it is assumed that the parity-check matrix $H_2$ of an LDPC code satisfies Rules 3 to 6 described above and thus $D_0 \leq \ldots \leq D_{K_1/M_1-2} \leq D_{K_1/M_1-1}$ is achieved.

Method for Designing DVB-S2 LDPC Code

Step 1: establish a matrix of $(N_2-K_2) \times (N_2-K_2)$, having the same structure as a partial matrix corresponding to the parity portion, to a partial matrix corresponding to a parity portion of the parity-check matrix $H_2$.

Step 2: initialize i=0.

Step 3: define a set $A_i^{(k)}$ composed of p sequences as shown in Equation (3), with respect to a sequence $R_{i,0}^{(k)}$ (k=1, 2, ..., $D_i$) representing information regarding the $i^{th}$ column group corresponding to information bits of the parity-check matrix $H_1$. p is a value defined by Rule 3.

$$A_i^{(k)} = \{R_{i,0}^{(k)}, R_{i,0}^{(k)} + (N_1-K_1), \ldots, R_{i,0}^{(k)} + (p-1) \times (N_1-K_1)\} \quad (3)$$

Step 4: assuming that there is no information word column group corresponding to $\{(N_2-K_2)/M_2-1\}^{th}$ column group from $(i+1)^{th}$ column group in the parity-check matrix $H_2$, acquire a sequence $S_{i,0}^{(k)}$ (k=1, 2, ..., $D_i$), sequentially, satisfying the following Conditions 1 and 2.

Condition 1

$S_{i,0}^{(k)} \in A_i^{(k)}$, where k=1, 2, ..., $D_i$.

Condition 2

Select one of the sequences satisfying Condition 1, which has the best characteristics of cycles on the Tanner graph. If a number of sequences contain the best characteristics of cycles, an arbitrary one can be selected.

Step 5: repeat steps 3 and 4 for i=1, $(N_2-K_2)/M_2-1$

Figure 6:
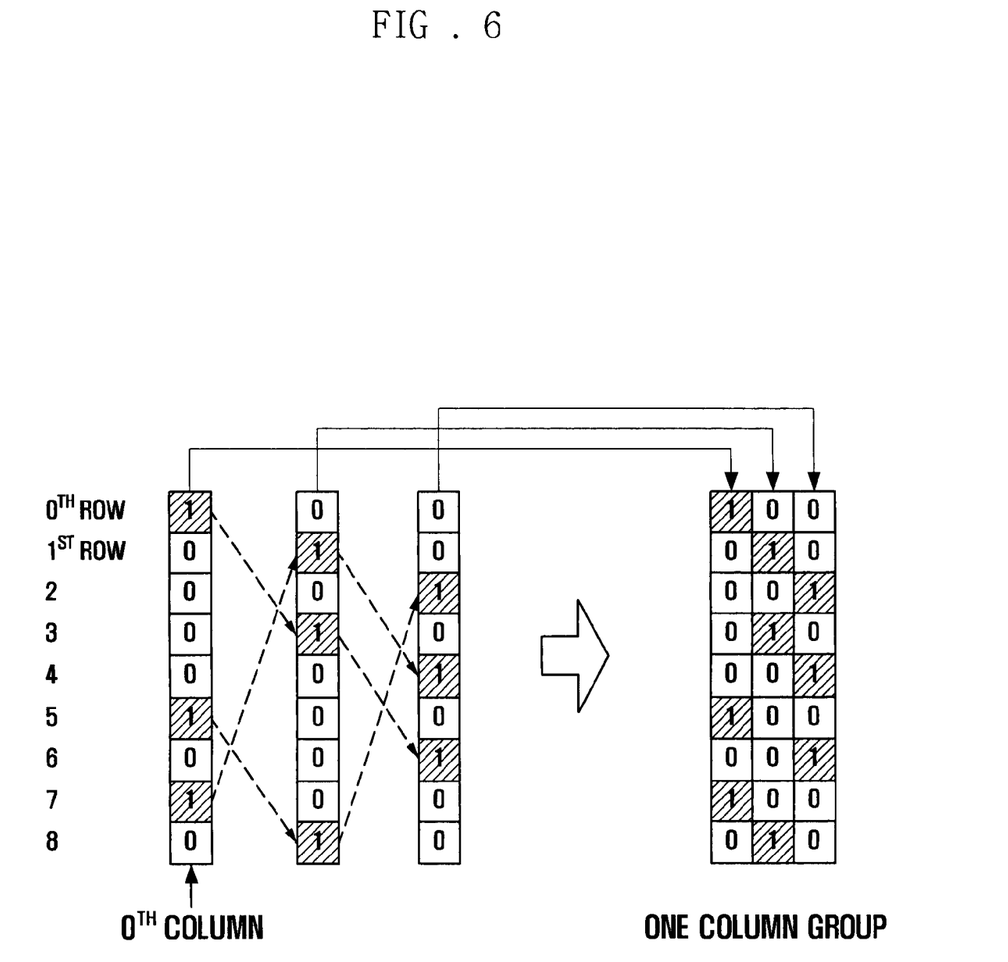
FIG. 6 shows a parity-check matrix that describes a method for designing a DVB-S2 LDPC code, according to the present invention.
Figure 7:
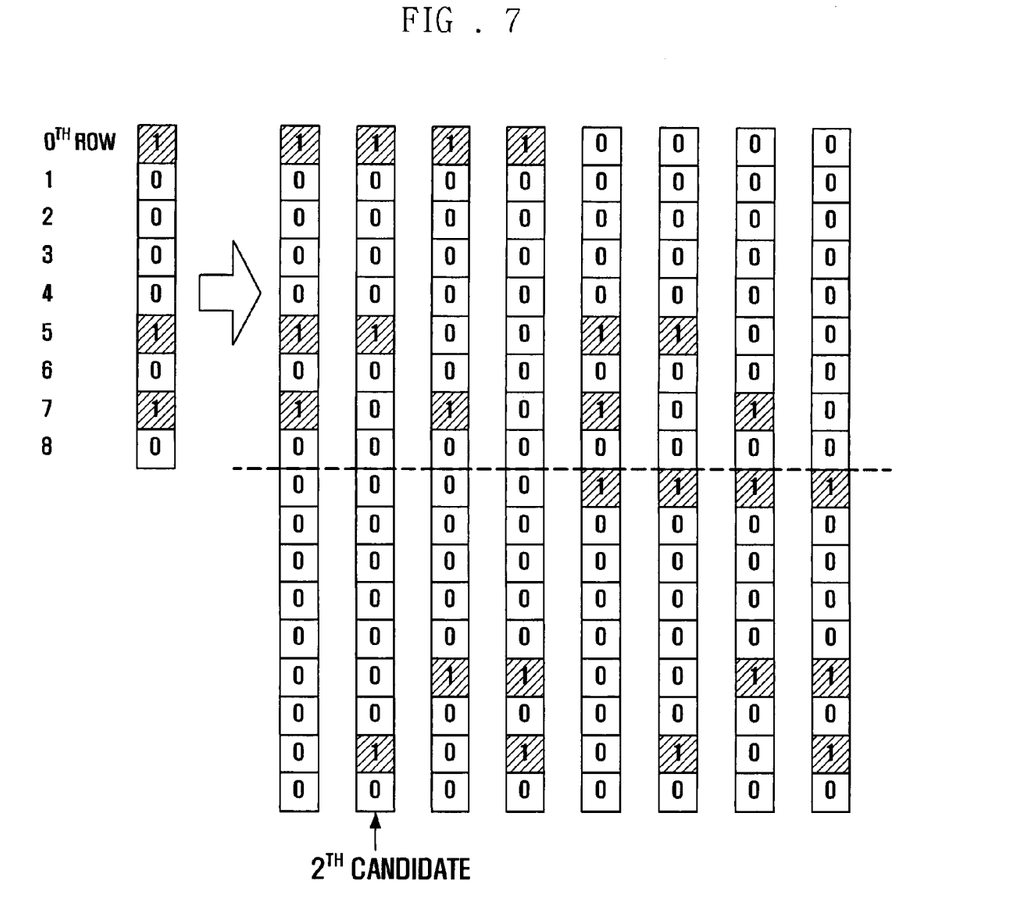
FIG. 7 shows a parity-check matrix that describes a method for designing a DVB-S2 LDPC code, according to the present invention.
Figure 8:
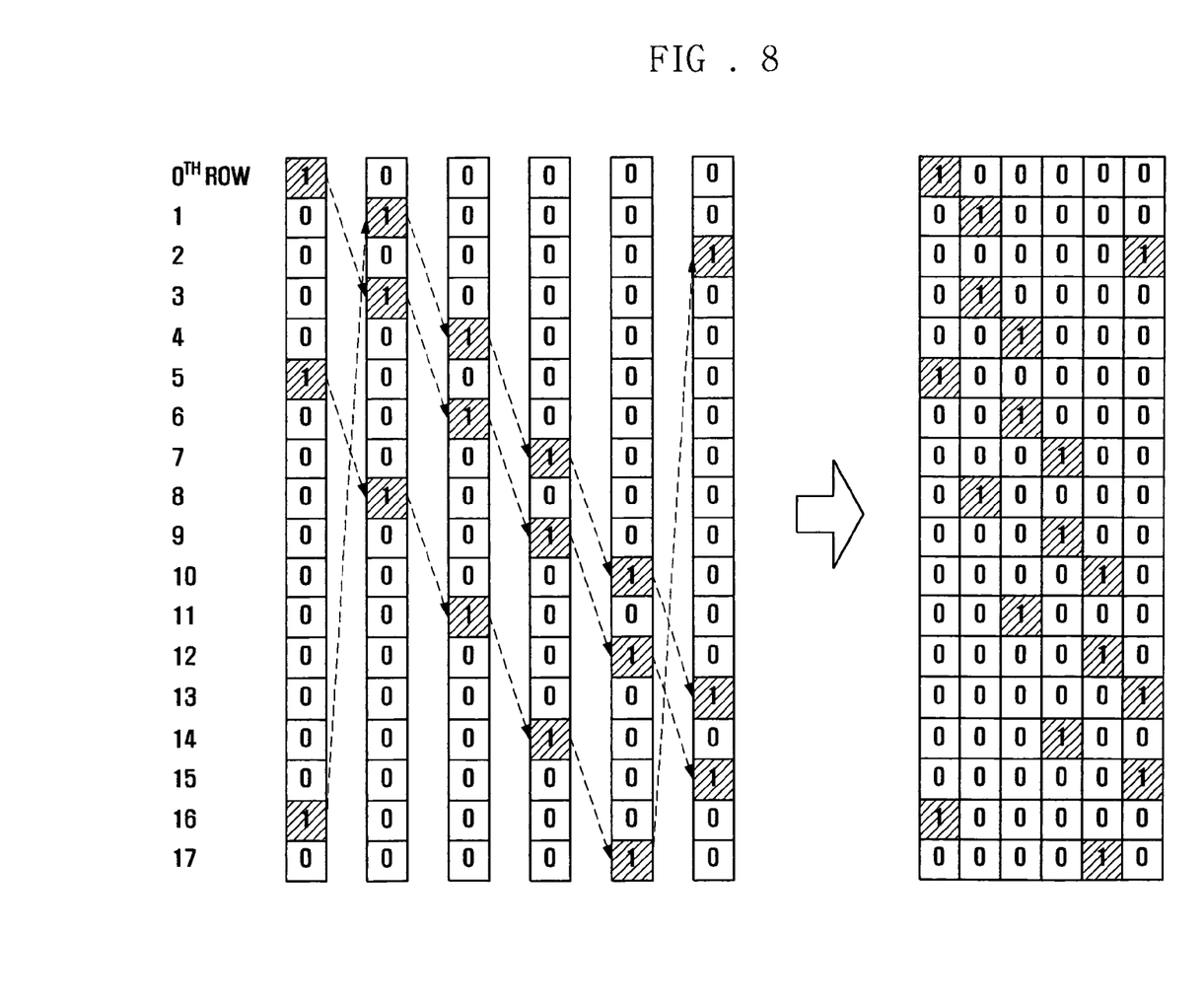
FIG. 8 shows a parity-check matrix that describes a method for designing a DVB-S2 LDPC code, according to the present invention.

FIGS. 6 to 8 are diagrams describing embodiments of a method for designing an LDPC code in the form of DVB S2, according to the present invention.

Referring to FIG. 6, variables are set as follows: $M_1=3$, p=2, $M_2=pM_1=6$, $(N_1-K_1)=9$, and $q=(N_1-K_1)/3=3$. Information of the positions of rows with weight 1 for the 0th column in one column group shown in FIG. 6 is: 0, 5, 7.

That is, in the 0th column in the one column group, only the 0th, fifth, and seven rows have weight 1. It will be easily noted that the first and second columns in the given column group can be acquired by cyclically shifting the positions of weight 1 in the 0th column by q=3, modulo $(N_1-K_1)=9$. In FIG. 6, the degrees of all columns in the column group are all 3 and the degrees of rows are all 1.

FIG. 7 shows a structure of the 0th column in a new group that can be acquired from the given column group of FIG. 6 by the method for designing DVB-S2 LDPC code. Since the information regarding the positions of rows with weight 1 in the 0th column shown in FIG. 6 is 0, 5, and 7, information regarding the positions of rows with weight 1 in the 0th column in the new column group can be expressed as one of the eight candidates, as follows, of Step 1 through Step 3 of the method for designing the DVB-S2 LDPC code:

{0, 5, 7}, {0, 5, 16}, {0, 7, 14}, {0, 14, 16}, {5, 7, 9}, {5, 9, 16}, {7, 9, 14}, {9, 14, 16}

The columns of the information regarding the positions of 8 rows are sequentially shown in FIG. 7.

It is assumed that a sequence satisfying Conditions 1 and 2 is determined as the second one of the 8 candidates, {0, 5, 16}, Step 4 of the method for designing the DVB-S2 LDPC code. In that case, the 0th column of a new column group can be defined as a column where the length of rows is 16, and each of the 0th, fifth and 16th columns has weight 1.

The 1st column to 5th ($=M_2-1$) column can be formed by applying the method for generating an LDPC code shown in FIG. 3 to the new 0th column. If cyclic shift is applied to the positions of weight 1 in the 0th column, by q=3, modulo $(N_1-K_1)=9$, according to the method for generating an LDPC code shown in FIG. 3, the remainder of the columns can be easily acquired. The process of the cyclic shift is illustrated in FIG. 8.

Referring to FIG. 8, it will be noted that the degrees of all columns in the column group are all 3, and the degrees of rows are all 1. That is, the distribution of the degree of information word portions in the embodiment of FIG. 8 is the same as the embodiment of FIG. 6.

The method for designing a DVB-S2 LDPC code satisfies Rules 3 to 6, as follows.

First, the method obviously satisfies Rules 3 and 4 according to its basic assumption.

In order to check the method with respect to Rule 5, it is assumed that $S_{i,0}^{(k)} = R_{i,0}^{(k)}$ for all i and k is fixed at Step 4 of the method for designing a DVB-S2 LDPC code. In this case, since the parity-check matrix $H_2$ is processed with the same structure as the parity-check matrix $H_1$, the matrix $H_2$ has the same characteristics of cycles of a Tanner graph as the matrix $H_1$. Therefore, the method for designing a DVB-S2 LDPC code obviously does not violate rule 5.

Since a sequence having the best characteristics of cycles on a Tanner graph is selected in the method for designing a DVB-S2 LDPC code, the selected sequence has the same or better characteristics of cycles than the case, $S_{i,0}^{(k)}=R_{i,0}^{(k)}$ for all i and k. That is, it will be noted that the worst case does not occur where the characteristics of cycles between the matrixes $H_1$ and $H_2$ are guaranteed to be the same and simultaneously are not deteriorated. Therefore, the method for designing a DVB-S2 LDPC code satisfies Rule 5 through Step 4.

The method for designing a DVB-S2 LDPC code is checked with respect to Rule 6. Information regarding column groups representing the parity-check matrix $H_2$, designed by the method for designing a DVB-S2 LDPC code, is defined as $S_{i,0}^{(k)}$ (where i=0, 1, . . . , $(N_2-K_2)/M_2-1$, and k=1, 2, . . . , $D_i$).

The sequence $S_{i,0}^{(k)}$ certainly takes a form of $S_{i,0}^{(k)}=R_{i,0}^{(k)}+I\times(N_1-K_1)$ for an integer I according to Step 3 of the method for designing a DVB-S2 LDPC code. Since $N_1$ and $K_1$ are known, $R_{i,0}^{(k)}$ can be easily derived from $S_{i,0}^{(k)}$ as shown in Equation (4).

$$S_{i,0}^{(k)}=R_{i,0}^{(k)} \bmod(N_1-K_1) \qquad (4)$$

Equation (4) describes that $R_{i,0}^{(k)}$ does not need to be stored but can be easily acquired by modulo operation of $(N_1-K_1)$ if information is available regarding column groups for the parity-check matrix $H_2$. Since the value q is the same with respect to the matrixes $H_1$ and $H_2$, the matrix $H_1$ can be acquired from the value of $R_{i,0}^{(k)}$ that is acquired from $S_{i,0}^{(k)}$. Therefore, the method for designing a DVB-S2 LDPC code satisfies Rule 6.

In an embodiment of the present invention, the method for designing a DVB-S2 LDPC code is explained in such a way that the parity-check matrix $H_2$ is acquired from the parity-check matrix $H_1$. If the method for designing a DVB-S2 LDPC code is repeatedly performed, a larger parity-check matrix can also be acquired.

It is possible to efficiently design a parity-check matrix as the method for designing a DVB-S2 LDPC code is repeatedly applied to the parity-check matrixes $H_1$, $H_2$, $H_3$, $H_S$ satisfying Equations (5), (6), and (7), $$N_1|N_2| \ldots |N_s \qquad (5)$$

$$K_1|K_2| \ldots |K_s \qquad (6)$$

$$M_1|M_2| \ldots |M_s \qquad (7)$$

where $N_i$, $K_i$, and $M_i$ refer to a codeword length of $H_i$, an information word length of $H_i$, and a unit of column group of $H_i$ at rule 1, respectively.

It is also possible to form the parity-check matrixes $H_1$, $H_2$, . . . , $H_{S-1}$ if information regarding the parity-check matrix $H_S$, acquired by the method for designing a DVB-S2 LDPC code, is known.

It will be appreciated that a plurality of various sized parity-check matrixes can be generated from one parity-check matrix as the parity-check matrix of an LDPC code satisfies Rule 6. The size of the parity-check matrix refers to the codeword length of an LDPC code. Therefore, it will be noted that the LDPC code, designed by the method of the present invention, can support LDPC codes that have a variety of block lengths through Equation (4). Although the method according to the present invention supports LDPC codes having a various sizes of block lengths, it stores only one piece of information regarding the parity-check matrix in a memory, thereby enhancing the storage efficiency of the memory.

The following Tables 1 to 4 are examples of a parity-check matrix $H_2$ designed as the method for designing a DVB-S2 LDPC code is applied to a parity-check matrix $H_1$ composed of variables described in Equation (8).

$$M_1=1, N_1=180, K_1=120, q=60, p=360, M_2=360,$$
$$N_2=64800, \text{ and } K_2=43200 \qquad (8)$$

TABLE 1

| | | | |
|---|---|---|---|
| 1264 2463 2556 3073 4370 12739 15418 16124 19807 19841 21010 21125 21171 | | | |
| 113 1852 3132 4996 5975 9197 9655 11694 13480 17613 18031 20266 20346 | | | |
| 444 3661 3722 5295 7401 8545 9028 10608 11828 14216 15585 20012 20577 | | | |
| 90 2079 6806 7162 7889 10969 11718 13211 13963 14300 15009 19379 20487 | | | |
| 2281 4322 5742 6974 7537 8903 13268 13439 17747 19986 20312 21388 21514 | | | |
| 271 1258 1720 1865 4339 7416 8198 8276 9832 14358 15553 15923 19689 | | | |
| 467 3367 3840 4942 6852 7525 8146 12648 14794 16503 17426 18327 19041 | | | |
| 1371 1602 11655 12611 14689 15360 15584 16913 18210 18357 18680 18734 19418 | | | |
| 3500 7181 7332 7679 9399 10942 11205 12514 17057 17928 18245 18264 20196 | | | |
| 187 961 1803 3439 3794 4518 8365 11201 14023 15238 16136 19487 20296 | | | |
| 455 4544 5241 7450 9100 11606 11948 14433 14874 15628 16082 17704 19351 | | | |
| 695 1929 5346 5497 7349 12046 17357 17372 17631 18109 18267 18475 19273 | | | |
| 1298 2951 17635 | | | |
| 495 650 11677 | | | |
| 653 6222 14805 | | | |
| 2274 9690 9743 | 11297 12566 14567 | 7281 17654 18609 | 2473 4923 14331 |
| 8760 14044 16012 | 8090 8146 19442 | 3449 12890 14460 | 839 6233 7840 |
| 8056 12933 15269 | 8493 10366 12434 | 701 9649 19076 | 1398 10270 13605 |
| 4243 9339 12774 | 3696 7696 15628 | 243 3130 11099 | 2097 4649 11467 |
| 2312 12024 20290 | 261 617 13196 | 7141 9684 10778 | 3530 5765 8743 |
| 4289 7187 16359 | 2958 5334 16260 | 10522 11425 13137 | 15475 16902 19208 |
| 1641 9284 17750 | 16845 17701 19088 | 5056 17464 21164 | 6993 12521 13333 |
| 7204 12854 14335 | 2552 16078 21113 | 542 4952 18819 | 5740 12083 19726 |
| 7387 8400 14186 | 3517 19451 20524 | 2616 4435 17063 | 3732 6440 7141 |
| 13818 16533 17156 | 11543 12109 12852 | 3348 5781 20818 | 9088 9154 12468 |
| 1677 1816 3263 | 5479 13538 18909 | 7087 11933 17417 | 2869 4396 8334 |
| 13150 13303 19272 | 2812 10594 11226 | 2812 3810 17336 | 6532 9457 14387 |
| 4433 16449 17397 | 6067 13659 19220 | 4328 11051 16035 | 1824 15244 20490 |
| 2188 5399 6750 | 6052 15205 17475 | 14374 15355 19910 | 4762 5874 12092 |
| 1625 7808 13669 | 3867 8650 17070 | 786 2520 7181 | 3231 8278 11367 |
| 1550 13884 17080 | 12553 20803 21588 | 17949 18263 19304 | 617 1563 2558 |
| 397 1801 7368 | 2411 3051 3354 | 5927 8048 13352 | 13411 15600 20409 |
| 2078 6302 14741 | 12454 18224 18506 | 504 7858 10998 | 3199 10422 11726 |
| 1153 2182 12546 | 4764 12313 16627 | 5135 13350 13392 | 889 7870 17425 |
| 8916 10519 12615 | 2562 8849 13143 | 3267 5581 21485 | 255 4679 20435 |
| 2255 10785 10851 | 6887 14015 18545 | 2318 10942 16588 | 4184 5153 19022 |
| 11862 15991 19165 | 10191 10519 13960 | 1460 19516 21166 | 4031 5859 18296 |

TABLE 1-continued

| | | | |
|---|---|---|---|
| 10594 13083 18567 | 8780 11212 18703 | 4248 14884 19339 | 2069 3014 13605 |
| 9659 13315 19220 | 4451 10126 19926 | 3565 9362 19476 | 4761 7956 14946 |
| 4411 13061 16858 | 273 6075 16827 | 703 4291 20357 | |
| 3702 7702 16415 | 5188 11832 21198 | 1154 6086 20199 | |
| 4420 5825 8937 | 6631 12585 17797 | 3537 14257 17073 | |

TABLE 2

1970 4567 4933 5884 6610 7776 10431 11744 13263 15185 15418 18761 19939
293 1566 2735 3136 3346 4434 6552 9213 9220 9655 10192 11551 12377
5545 5805 6688 7676 7737 10608 10821 13742 16155 16472 16644 18128 18961
131 1669 2487 2683 9920 11546 14178 17549 17589 18939 18990 20099 20602
827 6988 7559 8262 8543 9157 12214 13501 14702 14886 17612 19568 20174
319 2949 3176 4458 4660 4693 6516 9358 9638 12451 17363 19072 20465
2247 3685 5887 8220 10161 11846 11866 12423 16968 19067 19932 20074 21262
71 2475 5382 8654 11157 12390 13980 14600 15104 15231 15533 16538 17929
2064 2819 4476 4882 9394 11660 12948 14705 15977 19965 20172 20801 20859
187 356 2581 3794 4518 6079 8563 8698 10276 10345 10541 12483 18467
455 584 4674 5920 7810 10408 11606 12308 15484 16653 17882 18211 19101
329 1566 2026 3927 6673 9595 10251 12409 17357 18729 18992 19955 20017
2635 3398 12371
495 650 19537
8865 11142 14333

| | | | |
|---|---|---|---|
| 13050 14094 20783 | 9266 11297 21407 | 3141 17654 18609 | 2473 4923 21591 |
| 8760 12712 18364 | 6646 8090 11522 | 3449 6960 19670 | 839 7073 11080 |
| 2729 9916 19353 | 2866 4694 20733 | 1669 5981 10196 | 1398 3610 20085 |
| 5259 8623 12774 | 3696 11956 15388 | 3130 8939 21543 | 2097 4649 11467 |
| 2170 10952 21564 | 617 14721 21296 | 7141 9684 16118 | 3530 7325 10063 |
| 2129 7547 10119 | 2958 5334 16260 | 7617 13945 21502 | 15475 16902 19208 |
| 8721 10184 17750 | 12825 19088 19681 | 5056 17464 18584 | 573 5261 13333 |
| 10495 12854 21364 | 10438 14633 18512 | 542 4952 10059 | 10600 12083 19726 |
| 4087 5966 8400 | 6484 16837 19451 | 2616 4435 20843 | 2120 3732 9721 |
| 7616 17373 19278 | 5449 12852 16223 | 2988 13341 20818 | 9088 9274 12048 |
| 1816 8423 20097 | 3079 13538 18909 | 4253 13327 17417 | 4396 8334 14869 |
| 13150 14683 19272 | 10746 11554 11692 | 1312 13350 17336 | 6532 13357 14387 |
| 4433 16449 17397 | 6067 7299 12860 | 4328 11051 16035 | 1410 1824 15244 |
| 6750 7799 17848 | 15205 17595 21052 | 12410 15355 18334 | 562 5874 12092 |
| 7808 16309 16745 | 30 6670 11367 | 3401 17286 19020 | 3231 17338 21387 |
| 13600 13910 18384 | 7488 9943 12433 | 743 17624 19089 | 617 1563 9938 |
| 3301 19057 21168 | 2411 3354 15051 | 5927 8048 18092 | 13411 15600 20409 |
| 7301 17498 20702 | 3524 4834 13406 | 10998 13344 15958 | 3199 4782 17486 |
| 7522 12546 15253 | 12313 16627 18444 | 4775 13350 13392 | 7870 14029 17425 |
| 3576 10519 12555 | 10662 14883 17849 | 5581 9087 21485 | 8039 10875 20435 |
| 1115 6225 9591 | 1475 13967 18545 | 2318 5842 16588 | 5153 17924 19022 |
| 11971 12462 14005 | 10780 11479 15231 | 7486 8840 19516 | 1976 7899 15311 |
| 6334 8727 10383 | 472 14743 17420 | 1728 14224 19339 | 2069 3014 13605 |
| 1435 9659 15260 | 4126 4451 19926 | 9362 13645 19476 | 2241 7956 14946 |
| 4781 9118 12691 | 9153 12495 16827 | 4291 16063 20357 | |
| 16595 16762 20022 | 9148 11832 21198 | 1154 6219 13646 | |
| 8937 12665 15700 | 4951 5745 14797 | 1057 12357 17073 | |

TABLE 3

2599 2998 3291 3793 4567 5644 7476 8945 9250 11630 12041 12344 19983
113 5946 6640 7426 7577 10233 10831 12335 15672 15976 17995 20152 20514
1944 3315 4168 6117 6661 8745 10508 10608 10821 11636 12212 15145 19082
5549 7899 10946 11962 12090 17083 17847 18440 19631 20039 20089 20589 21258
239 3726 7468 7981 10028 11317 12462 15272 17747 19262 19403 20174 21514
563 2018 3439 4693 5458 7056 9391 9665 9832 10569 13076 14598 18340
467 5607 5665 6934 8062 9706 10101 10572 12288 15067 16083 17520 20906
311 1489 2790 3597 14820 15231 15255 15398 17333 18042 18224 18680 19454
2399 4145 4176 4659 6197 11205 12514 12620 17261 17928 20292 21384 21442
2716 3794 6478 7567 10083 10345 10541 13543 16561 16638 17876 19459 19487
2034 3004 6284 9100 11606 12393 13821 14548 14731 15790 16208 19442 21095
695 895 3606 5787 6673 7232 7357 7546 13517 14409 17631 18089 18109
1871 17078 17635
650 3495 19537
13253 14562 21465

| | | | |
|---|---|---|---|
| 17010 18503 21534 | 4877 11066 14567 | 13694 17241 18609 | 8463 14331 19453 |
| 772 8760 14044 | 2450 8146 19442 | 3449 6960 19670 | 839 6233 11080 |
| 15796 17669 19353 | 9466 10514 20733 | 5801 8809 15536 | 1398 10270 18705 |

TABLE 3-continued

| | | | |
|---|---|---|---|
| 4303 9339 12774 | 3696 5116 15388 | 243 3130 11099 | 2097 4649 11467 |
| 9864 10810 18992 | 681 12437 13196 | 7141 8258 9684 | 3530 11143 16025 |
| 1649 11507 16359 | 4638 5334 16260 | 10462 13945 14037 | 11515 16902 19208 |
| 530 11504 17421 | 285 11341 19088 | 15496 17464 21164 | 573 12521 13333 |
| 3374 3415 20944 | 9653 12212 16078 | 11019 13382 21452 | 6803 19726 21100 |
| 7387 9000 18446 | 16837 19451 20524 | 2616 4435 18743 | 3732 7141 21140 |
| 4196 15198 17373 | 5063 6192 12109 | 5781 6528 20818 | 9088 9274 20868 |
| 1283 9297 11956 | 18458 18909 20899 | 3847 12353 14717 | 4396 8334 19189 |
| 252 7903 13630 | 2812 11226 11554 | 2812 13350 17336 | 6532 7897 14387 |
| 14813 16449 17397 | 6067 6800 15459 | 3555 4328 11051 | 1824 15244 17730 |
| 5399 12210 17848 | 11692 15205 17475 | 12410 14455 20434 | 4762 5874 7472 |
| 7808 10729 11165 | 1587 4410 5230 | 786 2520 19841 | 12831 17338 19527 |
| 9580 13910 15084 | 10333 12223 14508 | 743 4509 16724 | 1563 14138 14357 |
| 5317 6901 10368 | 2411 3354 14871 | 3467 8048 18092 | 13411 15600 20409 |
| 1802 8681 17498 | 2074 5744 16166 | 7858 10998 13344 | 3199 10422 11726 |
| 8593 12546 13042 | 16627 18444 19813 | 4775 10872 19350 | 889 7870 17425 |
| 679 5175 14436 | 3629 10662 13143 | 5581 7407 21485 | 1995 3599 14195 |
| 875 10551 10785 | 1475 15605 15767 | 2318 5722 19708 | 15764 18173 19022 |
| 2905 13651 20802 | 4699 5500 18891 | 8840 12796 21166 | 3956 15311 20379 |
| 1414 4143 14967 | 4912 8900 19663 | 4248 14884 21559 | 2069 3014 20265 |
| 3440 9659 13315 | 2206 4451 19926 | 9362 13645 17616 | 3366 7956 9681 |
| 3811 8441 16858 | 6867 9153 13395 | 703 4291 11777 | |
| 3702 6622 16595 | 1392 8008 21198 | 219 13646 18614 | |
| 5825 8937 17080 | 637 4951 12585 | 3537 14257 17073 | |

TABLE 4

| | | | |
|---|---|---|---|
| 1798 2990 8470 9859 10627 10743 11271 12344 13993 14076 15185 15461 15784 | | | |
| 455 3160 4973 9655 11973 16446 17717 19471 20034 20152 20266 20836 21072 | | | |
| 321 3008 3315 10608 12212 13425 14216 15448 17244 17577 18205 18541 21542 | | | |
| 409 1342 5051 7220 8083 8619 10047 10710 11546 15258 15989 16389 18179 | | | |
| 1242 1866 2354 2912 3388 5194 6023 11522 12481 12577 14768 17747 20459 | | | |
| 2589 2658 2816 3853 4625 7463 8378 9832 10951 11158 18499 18996 20320 | | | |
| 2066 4383 5487 5785 6492 10161 10847 14794 16440 18427 19486 20088 20542 | | | |
| 4358 5115 8693 8954 10964 12330 12791 13040 13860 14637 18042 19971 20269 | | | |
| 3500 3899 4176 6521 6605 12317 14194 15339 17172 17928 20985 21322 21384 | | | |
| 436 476 1154 3107 3127 3241 4278 4723 10541 12123 14278 16645 16759 | | | |
| 455 1084 4082 5980 6284 7854 9931 10833 11710 12386 19708 21368 21561 | | | |
| 2886 4287 6673 7546 8312 8317 9055 10397 11409 15351 16415 16489 16769 | | | |
| 2738 12371 17635 | | | |
| 495 650 3877 | | | |
| 653 14562 14805 | | | |
| 990 2274 3983 | 7826 11297 14807 | 7281 8174 18609 | 2473 4923 12231 |
| 8760 14044 16012 | 8090 16306 19442 | 5789 6960 20030 | 839 6173 20260 |
| 8056 8429 19353 | 434 9706 21093 | 1669 6221 19076 | 1398 2325 10270 |
| 2139 4303 12774 | 3696 11956 14788 | 243 3730 11099 | 2097 11467 16709 |
| 24 6850 8132 | 2237 13196 20481 | 8498 9684 12961 | 3530 10063 16025 |
| 7187 10709 16359 | 9138 15960 16494 | 9445 13137 21502 | 15475 16902 19208 |
| 164 8721 17750 | 3465 17701 19088 | 5056 17464 21164 | 12521 13333 19233 |
| 12854 14335 20944 | 5372 8633 16078 | 5492 7922 11019 | 7540 12083 19726 |
| 446 4627 8400 | 15877 19451 20524 | 4435 5616 14003 | 3732 7141 21140 |
| 3273 7616 12798 | 5063 12109 12852 | 8901 13548 20818 | 6448 9694 20868 |
| 1816 13403 16677 | 6259 13538 18909 | 2573 17417 20347 | 4396 8334 19369 |
| 7903 13150 19272 | 11226 12574 21112 | 1230 2812 17336 | 2272 14387 20257 |
| 4433 16449 17397 | 8707 12860 21399 | 4328 11051 16035 | 1410 1824 15244 |
| 5399 8730 15748 | 5812 17475 19165 | 12410 15355 20614 | 4762 5874 14972 |
| 11165 16568 21349 | 30 3747 5230 | 786 2520 7181 | 3231 17338 21387 |
| 2630 14860 18384 | 12223 12433 21588 | 6669 17843 19304 | 617 1563 10298 |
| 3301 5028 11677 | 2411 3354 6891 | 5927 8048 14312 | 13411 15600 20409 |
| 12782 14741 17498 | 2074 5744 17726 | 7858 10998 13344 | 3199 10422 14006 |
| 742 1153 12546 | 6024 12313 16987 | 4775 6030 13392 | 889 7870 17425 |
| 739 10596 12615 | 4469 10662 13143 | 4347 5581 21485 | 255 3599 8495 |
| 1115 10551 21585 | 5075 6887 18545 | 2318 7822 16588 | 5153 6044 19022 |
| 6085 8791 12462 | 4420 5479 10191 | 4906 8840 9916 | 639 1196 3431 |
| 10227 13083 21274 | 5743 9172 17420 | 4248 19339 20404 | 1274 2069 13605 |
| 9659 13315 15260 | 7811 16246 19926 | 9362 10956 17125 | 7956 9681 14946 |
| 1891 5038 15641 | 9153 13395 13707 | 16891 18163 20357 | |
| 16762 18695 19602 | 138 20052 21388 | 219 1154 13646 | |
| 1180 5825 18717 | 637 7831 12585 | 3537 10837 17073 | |

Figure 9:
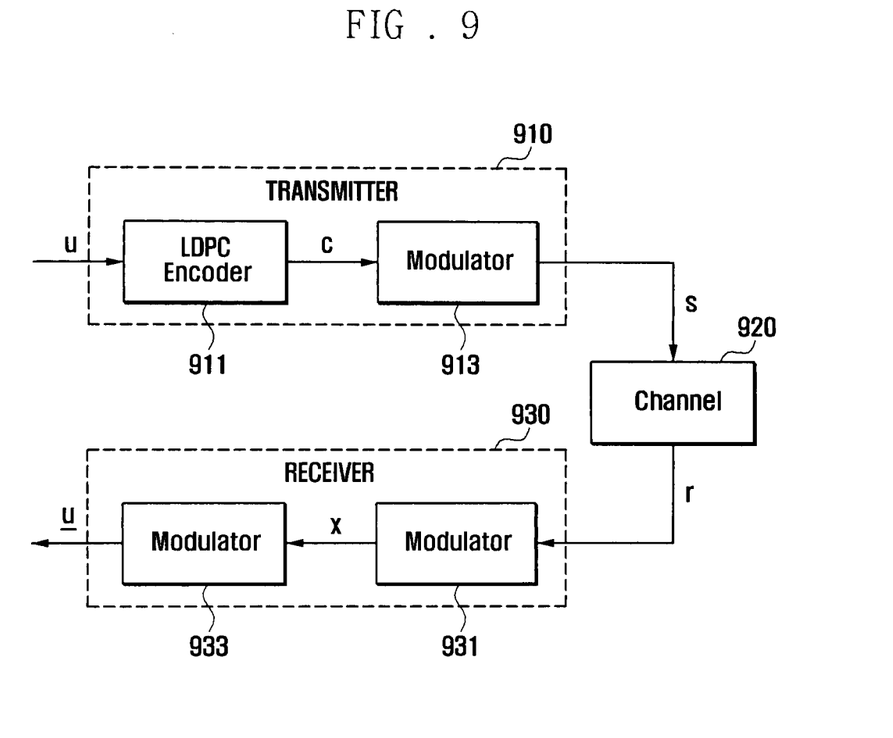
FIG. 9 is a block diagram illustrating a communication system using an LDPC code, according to an embodiment of the present invention.

FIG. 9 is a block diagram illustrating a communication system that encodes a DVB-S2 LDPC code, according to an embodiment of the present invention.

Referring to FIG. 9, an LDPC encoder 911 of a transmitter 910 encodes a message u. A modulator 913 modulates the encoded message c. The modulated signal s is transmitted via a Radio Frequency (RF) channel 920. A demodulator 931 of a receiver 930 demodulates a modulated signal r received via the RF channel 920. An LDPC decoder 933 decodes the demodulated signal x from the demodulator 931 and generates an estimate message u.

The LDPC encoder 911 generates a parity-check matrix to meet a block length, required by the communication system, using a predetermined method. In particular, in an embodiment of the present invention, the LDPC encoder 911 can support a parity-check matrix having a variety of block lengths using an LDPC code, without storage information.

Figure 10:
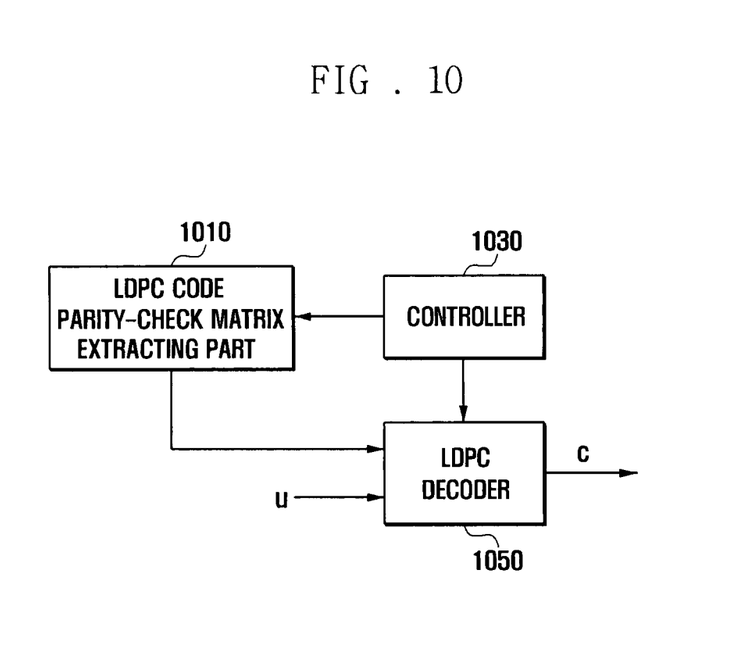
FIG. 10 is a block diagram illustrating a transmitter using an LDPC code, according to an embodiment of the present invention.

FIG. 10 is a block diagram illustrating a transmitter that encodes a DVB-S2 LDPC code, according to an embodiment of the present invention. Referring to FIG. 10, the transmitter includes an LDPC code parity-check matrix extracting part 1010, a controller 1030, and an LDPC encoder 1050. The parity-check matrix extracting part 1010 extracts a parity-check matrix of an LDPC code to meet the requirement of the communication system. The parity-check matrix of an LDPC code may be extracted, via the process of Equation (4), from information regarding a sequence finally acquired through the method for designing a DVB-S2 LDPC code. It may also be extracted using a memory that implements the parity-check algorithm itself. It may be provided from the transmitter or generated in the transmitter. The controller 1030 determines a parity-check matrix according to a codeword length or information word length to meet the requirement of the communication system. The LDPC encoder 1050 performs an encoding operation according to information regarding a parity-check matrix of an LDPC code that is loaded by the controller 1030 and the parity-check matrix extracting part 1010.

Figure 11:
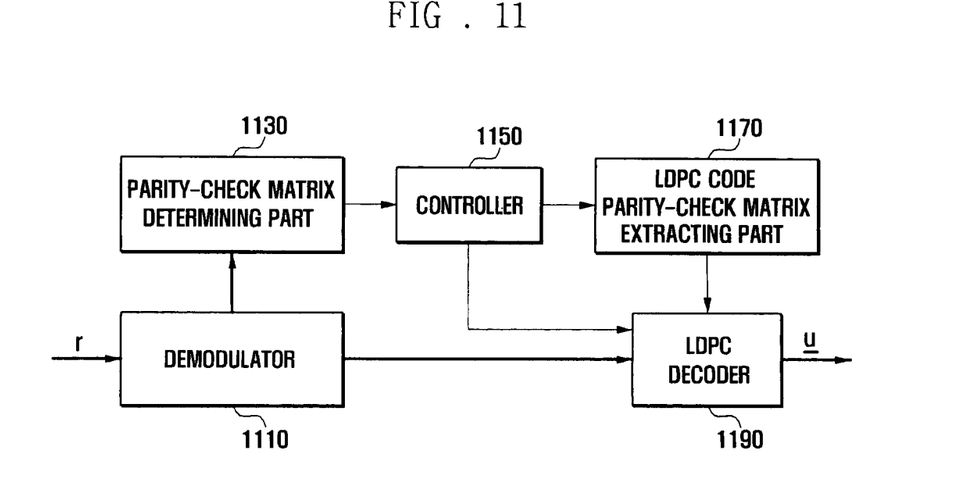
FIG. 11 is a block diagram illustrating a receiver using an LDPC code, according to an embodiment of the present invention.

FIG. 11 is a block diagram illustrating a receiver using an LDPC code, according to an embodiment of the present invention.

Referring to FIG. 11, the receiver receives a signal from the transmitter and restores the received signal to a user's original data.

The receiver includes a demodulator 1110, a parity-check matrix determining part 1130, an LDPC code parity-check matrix extracting part 1170, a controller 1150, and an LDPC decoder 1190.

The demodulator 1110 receives and demodulates a signal from the transmitter and outputs the demodulated signal to the parity-check matrix determining part 1130 and the LDPC decoder 1190. The parity-check matrix determining part 1130 determines a parity-check matrix of an LDPC code used in the communication system from the demodulated signal, under the control of the controller 1150. The controller 1150 outputs the result of the parity-check matrix determining part 1130 to the parity-check matrix extracting part 1170 and the LDPC decoder 1190. The parity-check matrix extracting part 1170 extracts a parity-check matrix of an LDPC code required by the communication system under the control of the controller 1150 and then outputs it to the LDPC decoder 1190. The parity-check matrix of an LDPC code may be extracted, via the process of Equation (4), from information regarding a sequence finally acquired through the method for designing a DVB-S2 LDPC code. It may also be extracted using a memory that implements the parity-check algorithm itself. It may be provided from the receiver or generated in the receiver. The LDPC decoder 1190 decodes the demodulated signal from the demodulator 1110 according to information regarding a parity-check matrix of an LDPC code from the parity-check matrix extracting part 1170, under the control of the controller 1150.

Figure 12:
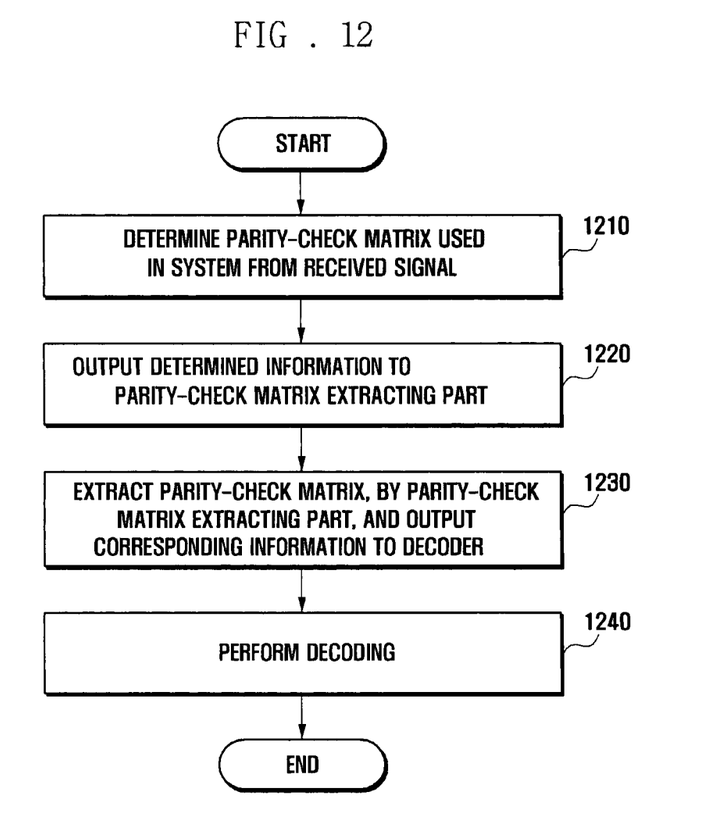
FIG. 12 is a flow chart describing a method for performing receiving operations in a receiver using an LDPC code, according to an embodiment of the present invention.

FIG. 12 is a flow chart describing a method for performing receiving operations in a receiver using an LDPC code, according to an embodiment of the present invention.

Referring to FIG. 12, a parity-check matrix used in the communication system is determined based on a received signal in step 1210. The determined information is output to the parity-check matrix extracting part 1170 in step 1220. The parity-check matrix extracting part 1170 extracts a parity-check matrix of an LDPC code required by the communication system and then outputs it to the LDPC decoder 1190 in step 1230. The LDPC decoder 1190 performs a decoding operation according to information regarding a parity-check matrix of an LDPC code from the parity-check matrix extracting part 1170 in step 1240.

As described above, the method and apparatus, according to the present invention, can efficiently design LDPC codes whose codeword is relatively long from a relatively small size of parity check matrix, while retaining the cycle characteristics on the sub-optimized Tanner graph, thereby designing the parity check matrix of LDPC codes whose codeword is relatively long.

The method and apparatus, according to the present invention, can generate LDPC codes having a variety of block lengths using information regarding a given parity check matrix in a communication system using the LDPC codes. Since the method and apparatus, according to the present invention, can support the LDPC codes having a variety of block lengths using a single parity check matrix, it can efficiently store information regarding the parity check matrix and allow for the easy extension of the system.

Although exemplary embodiments of the present invention have been described in detail hereinabove, it should be understood that many variations and modifications of the basic inventive concept herein described, which may be apparent to those skilled in the art, will still fall within the spirit and scope of the exemplary embodiments of the present invention as defined in the appended claims.

What is claimed is:

1. A method for encoding data using a Low-Density Parity-Check (LDPC) code, the method comprising the steps of:
    extracting first column group information, serving as a set of information regarding positions of rows with weight 1, from a reference column in each column group of a first parity-check matrix;
    transforming the first column group information into second column group information;
    generating a second parity-check matrix using the second column group information; and
    encoding data using the second parity-check matrix,
    wherein transforming the first column group information into the second column group information comprises:
    generating candidates for a reference column of a column group in the second column group information by shifting the positions of the rows with the weight 1 by a multiple of column length of the first parity-check matrix, wherein the shifted positions of the rows with the weight 1 are within a required column length of the second parity-check matrix; and
    forming the second column group information by selecting one of the candidates.

2. The method of claim 1, wherein generating the second parity-check matrix comprises:
    generating a first partial matrix corresponding to an information word portion using the second column group information;
    generating a second partial matrix of a dual diagonal shape, corresponding to a parity portion; and generating the second parity-check matrix by combining the first partial matrix and the second partial matrix.

3. A method for decoding data using a Low-Density Parity-Check (LDPC) code, the method comprising the steps of:
extracting first column group information, serving as a set of information regarding positions of rows with weight 1, from a reference column in each column group of a first parity-check matrix;
transforming the first column group information into second column group information;
generating a second parity-check matrix using the second column group information; and
decoding data using the second parity-check matrix,
wherein transforming the first column group information into the second column group information comprises:
generating candidates for a reference column of a column group in the second column group information by shifting the positions of the rows with the weight 1 by a multiple of column length of the first parity-check matrix, wherein the shifted positions of the rows with the weight 1 are within a required column length of the second parity-check matrix; and
forming the second column group information by selecting one of the candidates.

4. The method of claim 3, wherein generating the second parity-check matrix comprises:
generating a first partial matrix corresponding to an information word portion using the second column group information;
generating a second partial matrix of a dual diagonal shape, corresponding to a parity portion; and
generating the second parity-check matrix by combining the first partial matrix and the second partial matrix.

5. An apparatus for encoding data using a Low-Density Parity-Check (LDPC) code comprising:
an LDPC code parity-check matrix extracting part, for extracting first column group information, serving as a set of information regarding positions of rows with weight 1, from a reference column in each column group of a first parity-check matrix, transforming the first column group information into second column group information, and generating a second parity-check matrix using the second column group information; and
an LDPC encoder for encoding data using the second parity-check matrix,
wherein the LDPC code parity-check matrix extracting part transforms the first column group information into the second column group information by generating candidates for a reference column of a column group in the second column group information by shifting the positions of the rows with the weight 1 by a multiple of column length of the first parity-check matrix, wherein the shifted positions of the rows with the weight 1 are within a required column length of the second parity-check matrix, and forming the second column group information by selecting one of the candidates.

6. The apparatus of claim 5, wherein the LDPC code parity-check matrix extracting part generates a first partial matrix corresponding to an information word portion using the second column group information, a second partial matrix of a dual diagonal shape, corresponding to a parity portion, and the second parity-check matrix by combining the first partial matrix and the second partial matrix.

7. An apparatus for decoding data using a Low-Density Parity-Check (LDPC) code comprising:
an LDPC code parity-check matrix extracting part for extracting first column group information, serving as a set of information regarding positions of rows with weight 1, from a reference column in each column group of a first parity-check matrix, transforming the first column group information into second column group information, and generating a second parity-check matrix using the second column group information; and
an LDPC decoder for decoding data using the second parity-check matrix,
wherein the LDPC code parity-check matrix extracting part transforms the first column group information into the second column group information by generating candidates for a reference column of a column group in the second column group information by shifting the positions of the rows with the weight 1 by a multiple of column length of the first parity-check matrix, wherein the shifted positions of the rows with the weight 1 are within a required column length of the second parity-check matrix, and forming the second column group information by selecting one of the candidates.

8. The apparatus of claim 7, wherein the LDPC code parity-check matrix extracting part generates a first partial matrix corresponding to an information word portion using the second column group information, a second partial matrix of a dual diagonal shape, corresponding to a parity portion, and the second parity-check matrix by combining the first partial matrix and the second partial matrix.

* * * * *